US012268067B2

(12) United States Patent
Kim et al.

(10) Patent No.: US 12,268,067 B2
(45) Date of Patent: Apr. 1, 2025

(54) DISPLAY DEVICE AND METHOD OF MANUFACTURING THE SAME

(71) Applicant: Samsung Display Co., LTD., Yongin-si (KR)

(72) Inventors: Young Dae Kim, Seoul (KR); Jin Seock Kim, Seongnam-si (KR); Sang Jin Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 423 days.

(21) Appl. No.: 17/776,215

(22) PCT Filed: May 15, 2020

(86) PCT No.: PCT/KR2020/006420
§ 371 (c)(1),
(2) Date: May 11, 2022

(87) PCT Pub. No.: WO2021/096011
PCT Pub. Date: May 20, 2021

(65) Prior Publication Data
US 2022/0399431 A1 Dec. 15, 2022

(30) Foreign Application Priority Data
Nov. 12, 2019 (KR) .................. 10-2019-0144282

(51) Int. Cl.
*H01L 33/00* (2010.01)
*H10K 59/131* (2023.01)
(Continued)

(52) U.S. Cl.
CPC .......... *H10K 59/131* (2023.02); *H10K 71/00* (2023.02); *H10K 59/1201* (2023.02); *H10K 59/88* (2023.02)

(58) Field of Classification Search
CPC .. H10K 59/131; H10K 71/00; H10K 59/1201; H10K 59/88; H10K 59/87; H10K 50/84; H01L 27/12
(Continued)

(56) References Cited

U.S. PATENT DOCUMENTS 8,030,838 B2 10/2011 Kwak et al.
10,147,769 B2 12/2018 Lee et al.
(Continued)

FOREIGN PATENT DOCUMENTS

CN 101436608 5/2009
CN 108155300 6/2018
(Continued)

OTHER PUBLICATIONS

Chinese Office Action with English translation for Chinese Patent Application No. 202080078383.8, dated May 29, 2024.
(Continued)

*Primary Examiner* — Theresa T Doan
(74) *Attorney, Agent, or Firm* — KILE PARK REED & HOUTTEMAN PLLC

(57) ABSTRACT

A display device includes a substrate having a display area and a peripheral area, a pixel disposed on the substrate in the display area, the pixel including a pixel circuit, a pixel electrode electrically connected to the pixel circuit, an emission layer disposed on the pixel electrode, and an opposite electrode disposed on the emission layer, a power supply line disposed on the substrate in the peripheral area, the power supply line for supplying a power voltage to the pixel, an insulating layer covering the pixel circuit and the power supply line, the insulating layer including an opening exposing at least a portion of the power supply line, and a dummy pattern including a same material as the pixel electrode, the dummy pattern covering a sidewall of the
(Continued)

power supply line exposed by the opening of the insulating layer.

16 Claims, 9 Drawing Sheets

(51) Int. Cl.
*H10K 71/00* (2023.01)
*H10K 59/12* (2023.01)
*H10K 59/88* (2023.01)

(58) Field of Classification Search
USPC .......................................................... 257/91
See application file for complete search history.

(56) References Cited

U.S. PATENT DOCUMENTS

| | | | |
|---|---|---|---|
| 10,170,534 | B1 | 1/2019 | Kim et al. |
| 10,727,433 | B2 | 7/2020 | Lee et al. |
| 10,923,546 | B2 | 2/2021 | Park et al. |
| 11,063,238 | B2 | 7/2021 | Lee et al. |
| 2013/0037807 | A1* | 2/2013 | Fukaya ............. H01L 29/78696 438/151 |
| 2015/0008432 | A1 | 1/2015 | Kim et al. |
| 2015/0021564 | A1 | 1/2015 | Hong et al. |
| 2015/0116295 | A1 | 4/2015 | Pyon |
| 2018/0053788 | A1 | 2/2018 | Lee et al. |
| 2018/0061895 | A1* | 3/2018 | Kim ........................ H10K 59/87 |
| 2018/0144950 | A1 | 5/2018 | Jeong et al. |
| 2019/0229160 | A1 | 7/2019 | Lee et al. |

FOREIGN PATENT DOCUMENTS

| | | |
|---|---|---|
| CN | 108172597 | 6/2018 |
| CN | 110289282 | 9/2019 |
| CN | 110416261 | 11/2019 |
| KR | 10-2005-0068843 | 7/2005 |
| KR | 10-2010-0130523 | 12/2010 |
| KR | 10-1385457 | 4/2014 |
| KR | 10-2016-0084546 | 7/2016 |
| KR | 10-2019-0031397 | 3/2019 |

OTHER PUBLICATIONS

Written Opinion of International Searching Authority dated Aug. 26, 2020 for International Patent Application No. PCT/KR2020/006420.
International Search Report dated Aug. 26, 2020 in International Application No. PCT/KR2020/006420 (with English Translation).
Chinese Office Action with English translation for Chinese Patent Application No. 202080078383.8, dated Nov. 28, 2024.

* cited by examiner exposing at least a portion of the power supply line; and forming a dummy pattern covering a sidewall of the power supply line exposed by the opening of the insulating layer; and

DISPLAY DEVICE AND METHOD OF MANUFACTURING THE SAME

CROSS REFERENCE TO RELATED APPLICATION

This application is a National Stage Entry of International Application No. PCT/KR2020/006420, filed May 15, 2020, which claims priority to and the benefit of Korean Patent Application No. 10-2019-0144282, filed Nov. 12, 2019, each of which is hereby incorporated by reference for all purposes as if fully set forth herein.

BACKGROUND

Field

Embodiments of the invention relate generally to a display device and a method of manufacturing the display device and more particularly, to a display device having a dummy pattern for preventing dark spot defects, short-circuit defects, etc. and a method of manufacturing the display device.

Discussion of the Background

Recently, an importance of a flat panel display device, which has a small thickness, a light weight, low power consumption, etc., has been increasing. A liquid crystal display device and an organic light emitting display device as the flat panel display device are broadly commercialized due to their advantages such as excellent resolution, image quality, etc. The organic light emitting display device has been attracting attention due to its advantages such as a wide viewing angle, a high contrast, and a high response speed.

The display device may include a light emitting element formed in a display area and a wiring formed in a peripheral area. The light emitting element may include electrodes and an emission layer, which is interposed between the electrodes and emits light.

When a conductive layer is formed in the display area and the peripheral area and the conductive layer is etched to form an electrode of the light emitting element, the wiring and the conductive layer may induce a galvanic reaction in a presence of an electrolyte. The galvanic reaction is an electrochemical process in which a metal ion is reduced based on oxidation-reduction reactions when two metals having different standard reduction potentials from each other are connected by the electrolyte. The galvanic reaction may occur when standard reduction potentials of materials included in the conductive layer and the wiring are relatively greatly different.

The above information disclosed in this Background section is only for understanding of the background of the inventive concepts, and, therefore, it may contain information that does not constitute prior art.

SUMMARY

Display devices constructed according to the principles of the invention are capable of preventing or minimizing dark spot defects, short-circuit defects, etc., by forming a dummy pattern covering a power supply line to prevent a galvanic reaction on the power supply line.

Methods of manufacturing the display devices according to the principles of the invention are capable of reducing manufacturing times and manufacturing costs.

According to an aspect of the invention, a display device includes a substrate having a display area and a peripheral area; a pixel disposed on the substrate in the display area, the pixel including a pixel circuit, a pixel electrode electrically connected to the pixel circuit, an emission layer disposed on the pixel electrode, and an opposite electrode disposed on the emission layer; a power supply line disposed on the substrate in the peripheral area, the power supply line for supplying a power voltage to the pixel; an insulating layer covering the pixel circuit and the power supply line, the insulating layer having an opening exposing at least a portion of the power supply line; and a dummy pattern including a same material as the pixel electrode, the dummy pattern covering a sidewall of the power supply line exposed by the opening of the insulating layer.

The power supply line may include a first layer, a second layer disposed on the first layer, and a third layer disposed on the second layer, and the dummy pattern may include a material inducing a galvanic reaction with the second layer of the power supply line in a presence of an electrolyte.

The dummy pattern may include silver (Ag).

The second layer of the power supply line may include aluminum (Al).

The dummy pattern may include a first layer, a second layer disposed on the first layer, and a third layer disposed on the second layer, and the second layer of the dummy pattern may include a material inducing a galvanic reaction with the second layer of the power supply line in a presence of an electrolyte.

The second layer of the dummy pattern may include silver (Ag).

The dummy pattern may cover a sidewall of the second layer of the power supply line.

The first layer and the third layer of the power supply line may respectively cover a lower surface and an upper surface of the second layer of the power supply line.

A sidewall of the insulating layer may surround the dummy pattern.

The dummy pattern may cover a portion of an upper surface of the power supply line exposed by the opening of the insulating layer.

The dummy pattern may include an outer portion overlapping the sidewall of the power supply line exposed by the opening of the insulating layer.

The dummy pattern may further include an inner portion overlapping an upper surface of the power supply line exposed by the opening of the insulating layer.

The inner portion of the dummy pattern may include a plurality of lines connecting different portions of the outer portion of the dummy pattern.

The plurality of lines of the inner portion of the dummy pattern may be substantially parallel to each other.

The pixel circuit may include an active layer, a gate electrode overlapping the active layer, and source and drain electrodes electrically connected to the active layer, and the power supply line may include a same material as the source and drain electrodes.

The display device may further include a driving voltage line connecting the pixel to the power supply line, and the power supply line may be to supply the power voltage to the driving voltage line.

According to another aspect of the invention, a method of manufacturing a display device includes the steps of forming a pixel circuit on a substrate in a display area; forming a power supply line on the substrate in a peripheral area; forming an insulating layer on the pixel circuit and the power supply line, the insulating layer having an opening exposing at least a portion of the power supply line; forming a pixel electrode layer on the insulating layer; etching the pixel electrode layer to simultaneously form a pixel electrode electrically connected to the pixel circuit and a dummy pattern covering a sidewall of the power supply line exposed by the opening of the insulating layer; and sequentially forming an emission layer and an opposite electrode on the pixel electrode.

The step of etching the pixel electrode layer may include the steps of: forming a photoresist pattern on the pixel electrode layer; and providing an etchant on the pixel electrode layer on which the photoresist pattern is formed, and the etchant may not contact the sidewall of the power supply line which is exposed by the opening of the insulating layer.

The power supply line may include a first layer, a second layer disposed on the first layer, and a third layer disposed on the second layer, and the pixel electrode layer may include a material inducing a galvanic reaction with the second layer of the power supply line in a presence of an electrolyte.

In the display device according to the embodiments, the dummy pattern may cover the sidewall of the power supply line, so that a reaction between silver ions ($Ag^+$) generated in the process of forming the pixel electrode and aluminum atoms (Al) included in the power supply line may not occur. Accordingly, dark spot defects, short-circuit defects, etc. due to silver atoms (Ag) may be prevented.

In the method of manufacturing the display device according to the embodiments, the dummy pattern and the pixel electrode may be substantially simultaneously formed, so that an additional process for forming the dummy pattern may not be required. Accordingly, manufacturing times and manufacturing costs of the display device may be reduced.

The above information disclosed in this Background section is only for understanding of the background of the inventive concepts, and, therefore, it may contain information that does not constitute prior art.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
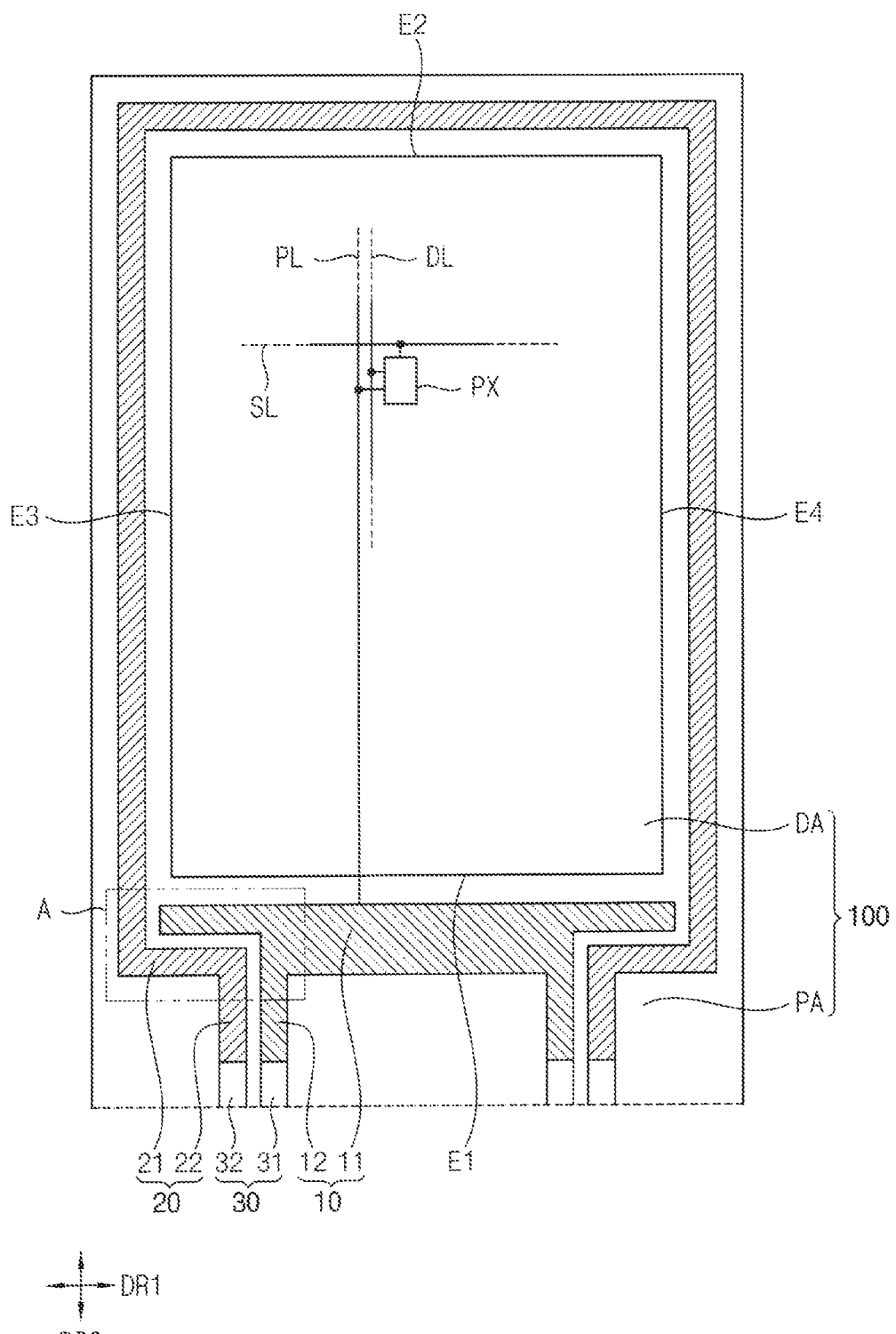
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices and methods of manufacturing display devices in accordance with embodiments will be explained in detail with reference to the accompanying drawings.

Figure 2:
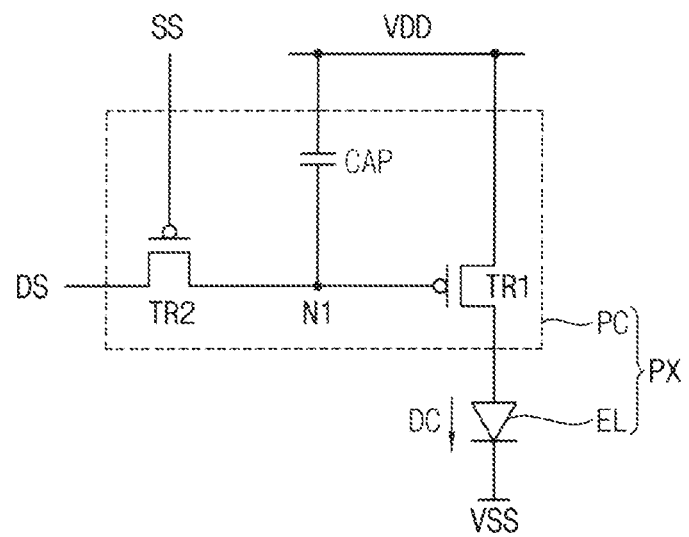
FIG. 2 is a circuit diagram of a representative pixel in FIG. 1.

FIG. 1 is a plan view illustrating a display device according to an embodiment. FIG. 2 is a circuit diagram illustrating a pixel PX in FIG. 1.

Referring to FIGS. 1 and 2, a display device according to an embodiment may include a substrate 100, a plurality of pixels PX, a first power supply line 10, a second power supply line 20, and a pad portion 30.

The substrate 100 may include a display area DA and a peripheral area PA. The display area DA may have a polygonal shape or a circular shape in a plan view. For example, the display area DA may have a rectangular shape including a first side edge E1, a second side edge E2, a third side edge E3, and a fourth side edge E4. For example, the first side edge E1 and the second side edge E2 may be positioned opposite to each other, and the third side edge E3 and the fourth side edge E4 may connect the first side edge E1 and the second side edge E2, and may be positioned opposite to each other.

The peripheral area PA may be adjacent to the display area DA. In an embodiment, the peripheral area PA may surround the display area DA. For example, the peripheral area PA may surround the first, second, third, and fourth side edges E1, E2, E3, and E4 of the display area DA.

The pixels PX may be disposed in the display area DA on the substrate 100. Each of the pixels PX may emit light, and the display device may display an image formed of the light emitted from each of the pixels PX. Each of the pixels PX may be electrically connected to a scan line SL extending in a first direction DR1, a data line DL and a driving voltage line PL extending in a second direction DR2 crossing the first direction DR1.

Each of the pixels PX may include a pixel circuit PC and a light emitting element FT, electrically connected to the pixel circuit PC. The pixel circuit PC may receive a scan signal SS, a data signal DS, and a driving voltage VDD transmitted from the scan line SL, the data line DL, and the driving voltage line PL, respectively, to generate a driving current DC, and may provide the driving current DC to the light emitting element EL. The light emitting element EL may receive a common voltage VSS, and may emit light based on the driving current DC provided from the pixel circuit PC.

The pixel circuit PC may include a plurality of transistors and at least one capacitor. In an embodiment, the pixel circuit PC may include a first transistor TR1, a second transistor TR2, and a capacitor CAP. However, embodiments are not limited thereto, and in another embodiment, the pixel circuit PC may include three or more transistors and/or two or more capacitors.

A gate electrode of the first transistor TR1 may be connected to a first node N1. The driving voltage VDD may be applied to a source electrode of the first transistor TR1, and a drain electrode of the first transistor TR1 may be connected to the light emitting element EL. The first transistor TR1 may generate the driving current DC based on a voltage between the gate electrode and the source electrode of the first transistor TR1, and may transmit the driving current DC to the light emitting element EL.

The scan signal SS may be applied to a gate electrode of the second transistor TR2. The data signal DS may be applied to a source electrode of the second transistor TR2, and a drain electrode of the second transistor TR2 may be connected to the first node N1. The second transistor TR2 may transmit the data signal DS to the first node N1 based on the scan signal SS.

The driving voltage VDD may be applied to a first electrode of the capacitor CAP, and a second electrode of the capacitor CAP may be connected to the first node N1. The capacitor CAP may maintain the voltage between the gate electrode and the source electrode of the first transistor TR1 even when the second transistor TR2 is turned off, so that the light emitting element FT, may emit light.

A pixel electrode of the light emitting element EL may be connected to the pixel circuit PC, and the common voltage VSS may be applied to an opposite electrode of the light emitting element EL. In an embodiment, the common voltage VSS may be less than the driving voltage VDD. The light emitting element EL may emit light based on the driving current DC transmitted from the pixel circuit PC.

The first power supply line 10 and the second power supply line 20 may be disposed in the peripheral area PA on the substrate 100. In an embodiment, the first power supply line 10 may extend along the first side edge E1 of the display area DA, and the second power supply line 20 may extend along the second side edge E2, the third side edge E3, and the fourth side edge E4 of the display area DA. For example, the first power supply line 10 may be disposed between the first side edge E1 of the display area DA and the pad portion 30, and the second power supply line 20 may partially surround the display area DA in a loop shape in which an area corresponding to the first side edge E1 of the display area DA is open.

The first power supply line 10 may include a first body portion 11 and a first connection portion 12. The first body portion 11 may extend in the first direction DR1 along the first side edge E1 of the display area DA. A length of the first body portion 11 in the first direction DR1 may be greater than or substantially equal to a length of the first body portion 11 of the display area DA in the first direction DR1. The first connection portion 12 may extend from the first body portion 11 in the second direction DR2 to be connected to a first pad 31 of the pad portion 30.

The second power supply line 20 may include a second body portion 21 and a second connection portion 22. The second body portion 21 may extend along the second side edge E2, the third side edge E3, and the fourth side edge E4 of the display area DA. The second body portion 21 may partially surround the display area DA along the second side edge E2, the third side edge E3, and the fourth side edge E4 except for the first side edge E1 of the display area DA. The second body portion 21 of the second power supply line 20 may wrap around opposite ends of the first body portion 11 of the first power supply line 10. The second connection portion 22 may extend from the second body portion 21 in the second direction DR2 to be connected to a second pad 32 of the pad portion 30.

The pad portion 30 may be disposed at an end of the peripheral area PA on the substrate 100. The pad portion 30 may be electrically connected to an external controller through a flexible printed circuit board (FPCB) or the like. Signals, voltages, or the like of the controller may be provided to the pixels PX through the pad portion 30.

The first power supply line 10 may provide the driving voltage VDD to the pixels PX, and the second power supply line 20 may provide the common voltage VSS to the pixels PX. The driving voltage VDD may be provided to the pixels PX through the driving voltage line PL connected to the first power supply line 10. The common voltage VSS may be provided to the opposite electrode of the light emitting element EL. For transmission of the common voltage VSS, the second body portion 21 of the second power supply line 20 and the opposite electrode of the light emitting element FT, may be electrically connected to each other in the peripheral area PA.

Figure 3:
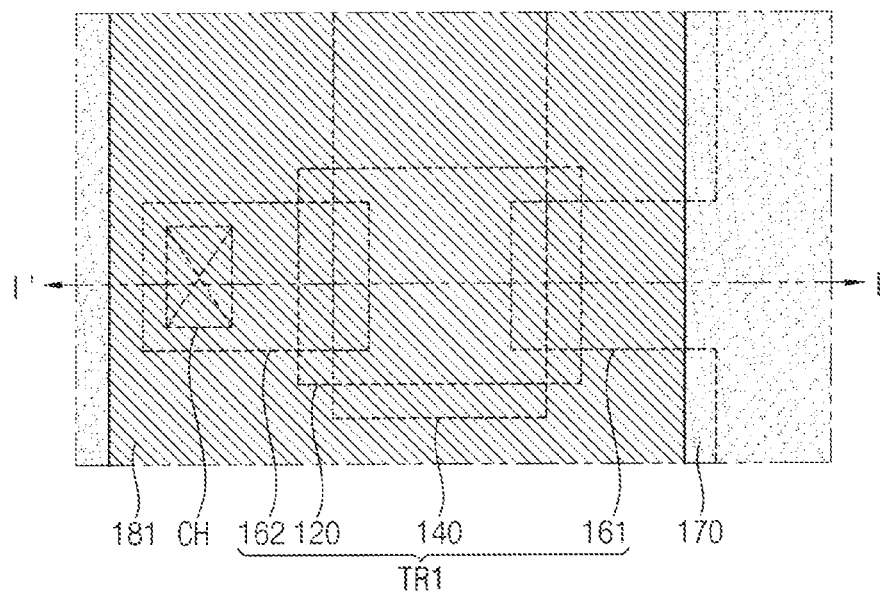
FIG. 3 is a plan view illustrating a portion of a display area in FIG. 1.
Figure 4:
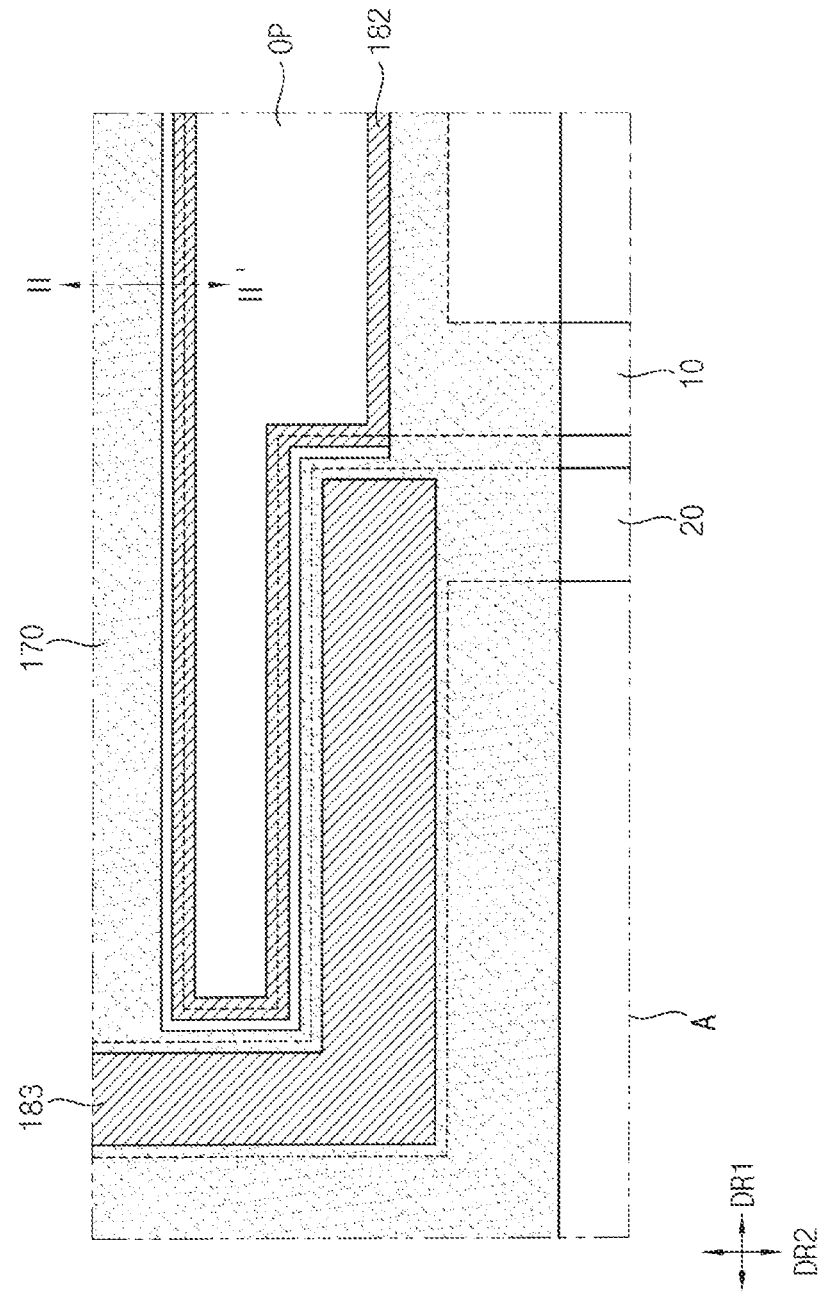
FIG. 4 is a plan view illustrating a portion of a peripheral area in FIG. 1.
Figure 5:
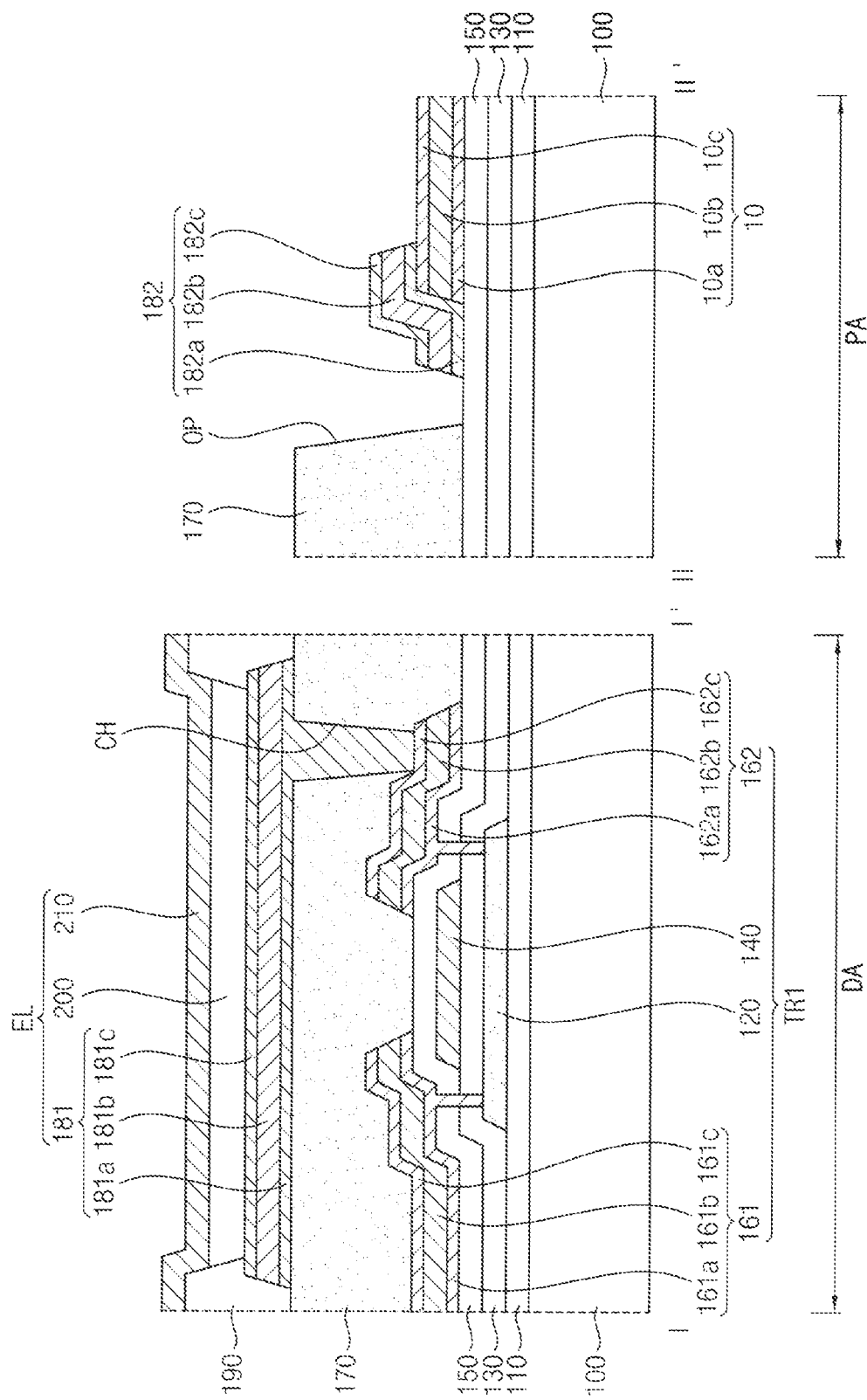
FIG. 5 is a cross-sectional view taken along a line I-I' in FIG. 3 and a line II-II' in FIG. 4.

FIG. 3 is a plan view illustrating a portion of the display area DA in FIG. 1. FIG. 4 is a plan view illustrating a portion of the peripheral area PA in FIG. 1. For example, FIG. 4 may illustrate an example of an area A in FIG. 1. FIG. 5 is a cross-sectional view taken along a line I-I' in FIG. 3 and a line II-II' in FIG. 4.

Referring to FIGS. 1, 3, 4, and 5, the substrate 100 may include glass, a polymer resin, or the like. For example, the polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), or the like. The substrate 100 may have a single-layer structure or a multilayer structure including the above-described materials.

A buffer layer 110 may be disposed on the substrate 100. The buffer layer 110 may extend from the display area DA to the peripheral area PA. The buffer layer 110 may prevent impurities such as moisture, oxygen, or the like from permeating into the display device through the substrate 100. The buffer layer 110 may include silicon oxide, silicon nitride, silicon oxynitride, or the like.

The active layer 120 may be disposed in the display area DA on the buffer layer 110. The active layer 120 may be formed of amorphous silicon, polycrystalline silicon, an oxide semiconductor, or the like. The active layer 120 may include a source region, a drain region, and a channel region between the source region and the drain region.

A gate insulating layer 130 may be disposed on the active layer 120. The gate insulating layer 130 may cover the active layer 120, and may be formed on the buffer layer 110. The gate insulating layer 130 may extend from the display area DA to the peripheral area PA. The gate insulating layer 130 may include silicon oxide, silicon nitride, silicon oxynitride, or the like.

A gate electrode 140 may be disposed on the gate insulating layer 130. The gate electrode 140 may overlap the active layer 120. For example, the gate electrode 140 may overlap the channel region of the active layer 120. The gate electrode 140 may include a conductive material such as a metal or an alloy of the metal. For example, the metal may include molybdenum (Mo), copper (Cu), or the like.

An insulating interlayer 150 may be disposed on the gate electrode 140. The insulating interlayer 150 may cover the gate electrode 140, and may be formed on the gate insulating layer 130. The insulating interlayer 150 may extend from the display area DA to the peripheral area PA. The insulating interlayer 150 may include silicon oxide, silicon nitride, silicon oxynitride, or the like.

A source electrode 161 and a drain electrode 162 may be disposed in the display area DA on the insulating interlayer 150. The source electrode 161 and the drain electrode 162 may be electrically connected to the active layer 120. For example, the source electrode 161 and the drain electrode 162 may contact the source region and the drain region of the active layer 120 through contact holes, respectively. Each of the source electrode 161 and the drain electrode 162 may include a conductive material such as a metal or an alloy of the metal. For example, the metal may include aluminum (Al), titanium (Ti), copper (Cu), or the like.

The first power supply line 10 and the second power supply line 20 may be disposed in the peripheral area PA on the insulating interlayer 150. Each of the first power supply line 10 and the second power supply line 20 may include a conductive material such as a metal or an alloy of the metal. For example, the metal may include aluminum (Al), titanium (Ti), copper (Cu), or the like. In an embodiment, the first power supply line 10 and the second power supply line 20 may include substantially the same material as the source electrode 161 and the drain electrode 162.

Each of the source electrode 161, the drain electrode 162, and the first power supply line 10 may have a multilayer structure. In an embodiment, each of the source electrode 161, the drain electrode 162, and the first power supply line 10 may have a triple-layer structure. For example, the source electrode 161 may include a first layer 161a, a second layer 161b disposed on the first layer 161a, and a third layer 161c disposed on the second layer 161b. The drain electrode 162 may include a first layer 162a, a second layer 162b disposed on the first layer 162a, and a third layer 162c disposed on the second layer 162b. The first power supply line 10 may include a first layer 10a, a second layer 10b disposed on the first layer 10a, and a third layer 10c disposed on the second layer 10b.

In an embodiment, the second layer 161b of the source electrode 161, the second layer 162b of the drain electrode 162, and the second layer 10b of the first power supply line 10 may include aluminum (Al), and the first layer 161a and the third layer 161c of the source electrode 161, the first layer 162a and the third layer 162c of the drain electrode 162, and the first layer 10a and the third layer 10c of the first power supply line 10 may include titanium (Ti).

In an embodiment, the first layer 10a and the third layer 10c of the first power supply line 10 may cover a lower surface and an upper surface of the second layer 10b of the first power supply line 10, respectively. Accordingly, the lower surface and upper surface of the second layer 10b of the first power supply line 10 may not be exposed.

The active layer 120, the gate electrode 140, the source electrode 161, and the drain electrode 162 may form the first transistor TR1. For example, the above-described second transistor TR2 in FIG. 2 and capacitor CAP in FIG. 2 may be disposed on the substrate 100 in the display area DA. The second transistor TR2 may include substantially the same components as the first transistor TR1. For example, the second transistor TR2 may include an active layer formed of the same material as the active layer 120, a gate electrode formed of the same material as the gate electrode 140, and a source electrode and a drain electrode formed of the same material as the source electrode 161 and the drain electrode 162 of the first transistor TR1. For example, the active layer 120 of the first transistor TR1 and the active layer of the second transistor TR2 may be disposed on the same layer (e.g., the buffer layer 110 or the substrate 100). For example, the gate electrode 140 of the first transistor TR1 and the gate electrode of the second transistor TR2 may be disposed on the same layer (e.g., the gate insulating layer 130). For example, the source and drain electrodes 161 and 162 of the first transistor TR1 and the source and drain electrodes of the second transistor TR2 may be disposed on the same layer (e.g., the insulating interlayer 150). The capacitor CAP may include a first electrode formed of the same material as the gate electrode 140 and a second electrode formed of the same material as the source electrode 161. For example, the first electrode of the capacitor CAP and the gate electrode 140 of the first transistor TR1 may be disposed on the same layer (e.g., the gate insulating layer 130), and the second electrode of the capacitor CAP and the source electrode 161 (or the drain electrode 162) of the first transistor TR1 may be disposed on the same layer (e.g., the insulating interlayer 150). The first transistor TR1, the second transistor TR2, and the capacitor CAP may form the pixel circuit PC in FIG. 2.

For example, the above-described second power supply line 20 may have substantially the same structure as the first power supply line 10. For example, the second power supply line 20 may include a first layer formed of the same material as the first layer 10a of the first power supply line 10, a second layer formed of the same material as the second layer 10b of the first power supply line 10, and a third layer formed of the same material as the third layer 10c of the first power supply line 10. For example, the first layer 10a of the first power supply line 10 and the first layer of the second power supply line 20 may be disposed on the same layer (e.g., the insulating interlayer 150). For example, the second layer of the second power supply line 20 may be disposed on the first layer of the second power supply line 20. For example, the third layer of the second power supply line 20 may be disposed on the second layer of the second power supply line 20. An insulating layer 170 may be disposed on the source electrode 161, the drain electrode 162, the first power supply line 10, and the second power supply line 20. The insulating layer 170 may be formed on the insulating interlayer 150 to cover the source electrode 161, the drain electrode 162, the first power supply line 10, and the second power supply line 20. The insulating layer 170 may extend from the display area DA to at least a portion of the peripheral area PA. For example, the insulating layer 170 may extend to cover a portion of the first connection portion 12 of the first power supply line 10 and a portion of the second connection portion 22 of the second power supply line 20. The insulating layer 170 may include polyimide or the like.

The insulating layer 170 may include a contact hole CH formed in the display area DA and an opening OP formed in the peripheral area PA. The contact hole CH may expose a portion of the drain electrode 162. For example, an upper surface of the drain electrode 162 may be exposed by the contact hole CH.

The opening OP may expose at least a portion of the first power supply line 10. For example, the opening OP may expose a portion of the first power supply line 10 adjacent to the display area DA. An upper surface and a sidewall of the first power supply line 10 may be exposed by the opening OP. For example, a sidewall of the first layer 10a, a sidewall of the second layer 10b, and a sidewall and an upper surface of the third layer 10c of the first power supply line 10 may be exposed by the opening OP. Further, an upper surface of the insulating interlayer 150 adjacent to the sidewall of the first power supply line 10 may be exposed by the opening OP.

A pixel electrode 181 may be disposed in the display area DA on the insulating layer 170. The pixel electrode 181 may be electrically connected to the first transistor TR1. For example, the pixel electrode 181 may contact the drain electrode 162 of the first transistor TR1 through the contact hole CH. The pixel electrode 181 may include a conductive material such as a metal or a transparent conductive oxide.

Referring to FIGS. 4 and 5, a dummy pattern 182 and a connection pattern 183 may be disposed in the peripheral area PA on the insulating layer 170. The dummy pattern 182 may cover the sidewall of the first power supply line 10 exposed by the opening OP of the insulating layer 170. For example, the dummy pattern 182 may cover the sidewall of the first layer 10a, the sidewall of the second layer 10b, and the sidewall of the third layer 10c of the first power supply line 10. In an embodiment, the dummy pattern 182 may additionally cover the upper surface of the first power supply line 10 exposed by the opening OP of the insulating layer 170. For example, the dummy pattern 182 may cover the upper surface of the third layer 10c of the first power supply line 10.

In an embodiment, the sidewall of the insulating layer 170 exposed by the opening OP may surround the dummy pattern 182. For example, the dummy pattern 182 may be formed to extend along the edge of the opening OP of the insulating layer 170 inside the sidewall of the insulating layer 170 in a plan view. In such an embodiment, the dummy pattern 182 may be spaced apart from the sidewall of the insulating layer 170 exposed by the opening OP at a predetermined distance, or may be in contact with the sidewall of the insulating layer 170.

The connection pattern 183 may overlap at least a portion of the second power supply line 20. The connection pattern 183 may extend along a planar shape in which the second power supply line 20 extends. The connection pattern 183 may be electrically connected to the second power supply line 20 in the peripheral area PA adjacent to the second side edge E2, the third side edge E3, and/or the fourth side edge E4 of the display area DA.

The dummy pattern 182 and the connection pattern 183 may include a conductive material such as a metal or a transparent conductive oxide. The dummy pattern 182 and the connection pattern 183 may include substantially the same material as the pixel electrode 181.

In an embodiment, the pixel electrode 181 and the dummy pattern 182 may include a material inducing a galvanic reaction with the second layer 10b of the first power supply line 10 in a presence of an electrolyte. For example, the pixel electrode 181 and the dummy pattern 182 may include silver (Ag).

The galvanic reaction refers to a phenomenon in which, when two metals having different standard reduction potentials from each other are connected by the electrolyte, a metal atom of one metal is oxidized and a metal ion of the other metal is reduced based on the movement of electrons by oxidation-reduction reactions. In a comparative example according to the prior art, in the process of forming the pixel electrode 181, silver atoms (Ag) included in the pixel electrode 181 are ionized to generate silver ions (Ag+), and the silver ions (Ag+) may be reduced to the silver atoms (Ag) and aluminum atoms (Al) may be oxidized to aluminum ions (Al+) by the galvanic reaction when the silver ions (Ag+) react with the aluminum atoms (Al) included in the second layer 10b of the first power supply line 10. In this case, dark spot defects, short-circuit defects, or the like may occur due to the silver atoms (Ag). However, in the embodiment, since the dummy pattern 182 covers the sidewall of the first power supply line 10, a reaction between silver ions (Ag+) generated in the process of forming the pixel electrode 181 and aluminum atoms (Al) included in the second layer 10b of the first power supply line 10 may not occur, because the second layer 10b of the first power supply line 10 including the aluminum atoms (Al) may be covered by the third layer 182c of the dummy pattern 182, which includes indium tin oxide (ITO) or indium zinc oxide (IZO) and does not include silver (Ag) or silver ion (Ag+). Thus, dark spot defects, short-circuit defects, or the like due to the silver atoms (Ag) may be prevented.

Each of the pixel electrode 181 and the dummy pattern 182 may have a multilayer structure. In an embodiment, each of the pixel electrode 181 and the dummy pattern 182 may have a triple-layer structure. For example, the pixel electrode 181 may include a first layer 181a, a second layer 181b disposed on the first layer 181a, and a third layer 181c disposed on the second layer 181b. The dummy pattern 182 may include a first layer 182a, a second layer 182b disposed on the first layer 182a, and a third layer 182c disposed on the second layer 182b.

In an embodiment, each of the second layer 181b of the pixel electrode 181 and the second layer 182b of the dummy pattern 182 may include a material inducing a galvanic reaction with the second layer 10b of the first power supply line 10 in a presence of the electrolyte. For example, the second layer 181b of the pixel electrode 181 and the second layer 182b of the dummy pattern 182 may include silver (Ag). The first layer 181a and the third layer 181c of the pixel electrode 181 and the first layer 182a and the third layer 182c of the dummy pattern 182 may include indium tin oxide (ITO) or indium zinc oxide (IZO).

For example, the connection pattern 183 may have substantially the same structure as the dummy pattern 182. For example, the connection pattern 183 may include a first layer formed of the same material as the first layer 182a of the dummy pattern 182, a second layer formed of the same material as the second layer 182b of the dummy pattern 182, and a third layer formed of the same material as the third layer 182c of the dummy pattern 182. For example, the first layer of the connection pattern 183 and the first layer 182a of the dummy pattern 182 may be disposed on the same layer (e.g., the insulating layer 170). For example, the second layer of the connection pattern 183 may be disposed on the first layer of the connection pattern 183. For example, the third layer of the connection pattern 183 may be disposed on the second layer of the connection pattern 183.

A pixel defining layer 190 may be disposed in the display area DA on the pixel electrode 181. The pixel defining layer 190 may cover the pixel electrode 181, and may be formed on the insulating layer 170. The pixel defining layer 190 may include a pixel opening exposing at least a portion of the pixel electrode 181, and the pixel defining layer 190 may cover a side portion of the pixel electrode 181. For example, an upper surface of the pixel electrode 181 may be exposed by the pixel opening. The pixel defining layer 190 may include polyimide or the like.

An emission layer 200 may be disposed in the pixel opening on the pixel electrode 181. The emission layer 200 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular weight organic compound may include poly(3,4-ethylenedioxythiophene), polyaniline, poly-phenylenevinylene, polyfluorene, or the like.

In an embodiment, the quantum dot may include a core including a group compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

An opposite electrode 210 may be disposed on the emission layer 200. The opposite electrode 210 may also be disposed on the pixel defining layer 190. The opposite electrode 210 may be electrically connected to the connection pattern 183 in the peripheral area PA adjacent to the second side edge E2, the third side edge E3, and/or the fourth side edge E4 of the display area DA. Accordingly, the common voltage VSS in FIG. 2 may be transmitted from the second power supply line 20 to the opposite electrode 210 through the connection pattern 183. The opposite electrode 210 may include a conductive material such as a metal or a transparent conductive oxide. The pixel electrode 181, the emission layer 200, and the opposite electrode 210 may form the light emitting element EL.

FIGS. 6, 7, 8, and 9 are cross-sectional views illustrating a method of manufacturing a display device according to an embodiment.

Figure 6:
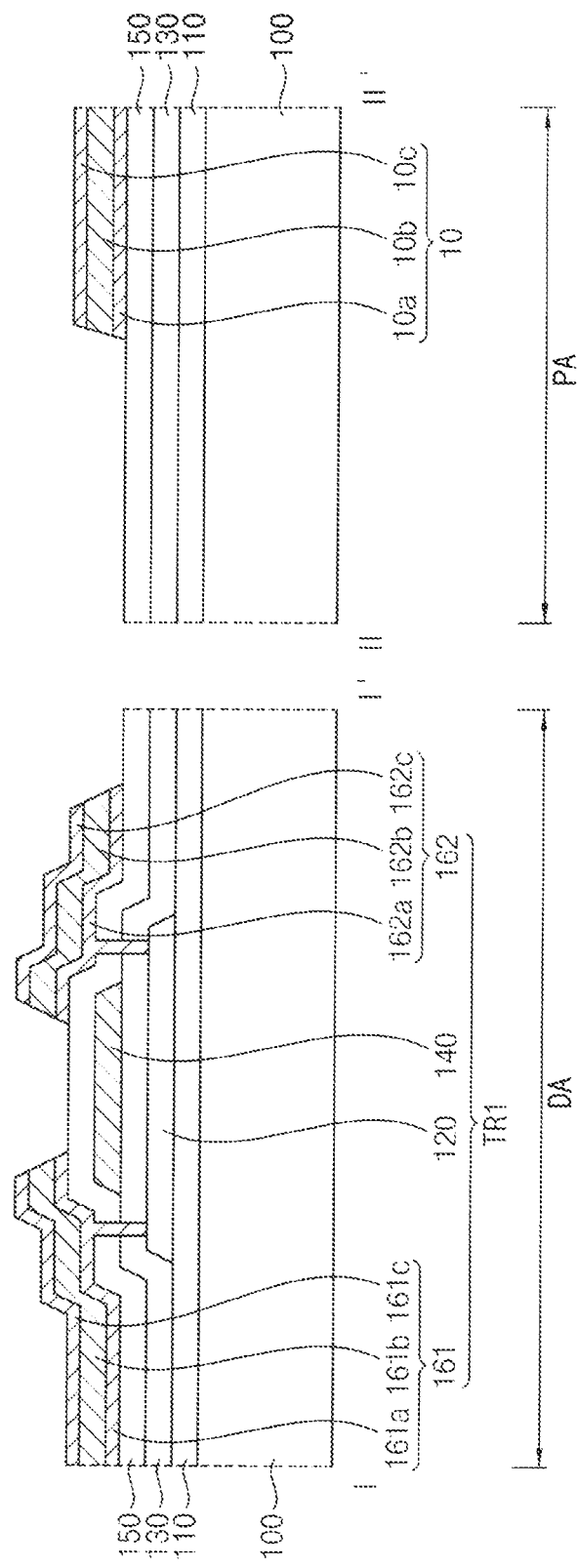
FIGS. 6, 7, 8, and 9 are cross-sectional views illustrating an embodiment of a method of manufacturing the display device of FIG. 1 according to the principles of the invention.

Referring to FIG. 6, the pixel circuit including the first transistor TR1 may be formed on the substrate 100 in the display area DA, and the first power supply line 10 may be formed on the substrate 100 in the peripheral area PA.

First, the buffer layer 110 may be formed on the substrate 100, and the active layer 120 may be formed on the buffer layer 110 in the display area DA.

Then, the gate insulating layer 130 covering the active layer 120 may be formed on the buffer layer 110, and the gate electrode 140 overlapping the active layer 120 may be formed on the gate insulating layer 130.

Then, the insulating interlayer 150 covering the gate electrode 140 may be formed on the gate insulating layer 130. The source electrode 161 and the drain electrode 162 connected to the active layer 120 may be formed on the insulating interlayer 150 in the display area DA. The first power supply line 10 may be formed on the insulating interlayer 150 in the peripheral area PA.

In an embodiment, the source electrode 161, the drain electrode 162, and the first power supply line 10 may be substantially simultaneously formed on the insulating interlayer 150. For example, a first layer including titanium (Ti), a second layer including aluminum (Al), and a third layer including titanium (Ti) may be sequentially formed in the display area DA and the peripheral area PA on the insulating interlayer 150, and the first, second, and third layers may be etched to substantially simultaneously form the source electrode 161, the drain electrode 162, and the first power supply line 10. Accordingly, the first power supply line 10 may be formed to include the first layer 10a including titanium (Ti), the second layer 10b disposed on the first layer 10a and including aluminum (Al), and the third layer 10c disposed on the second layer 10b and including titanium (Ti).

Figure 7:
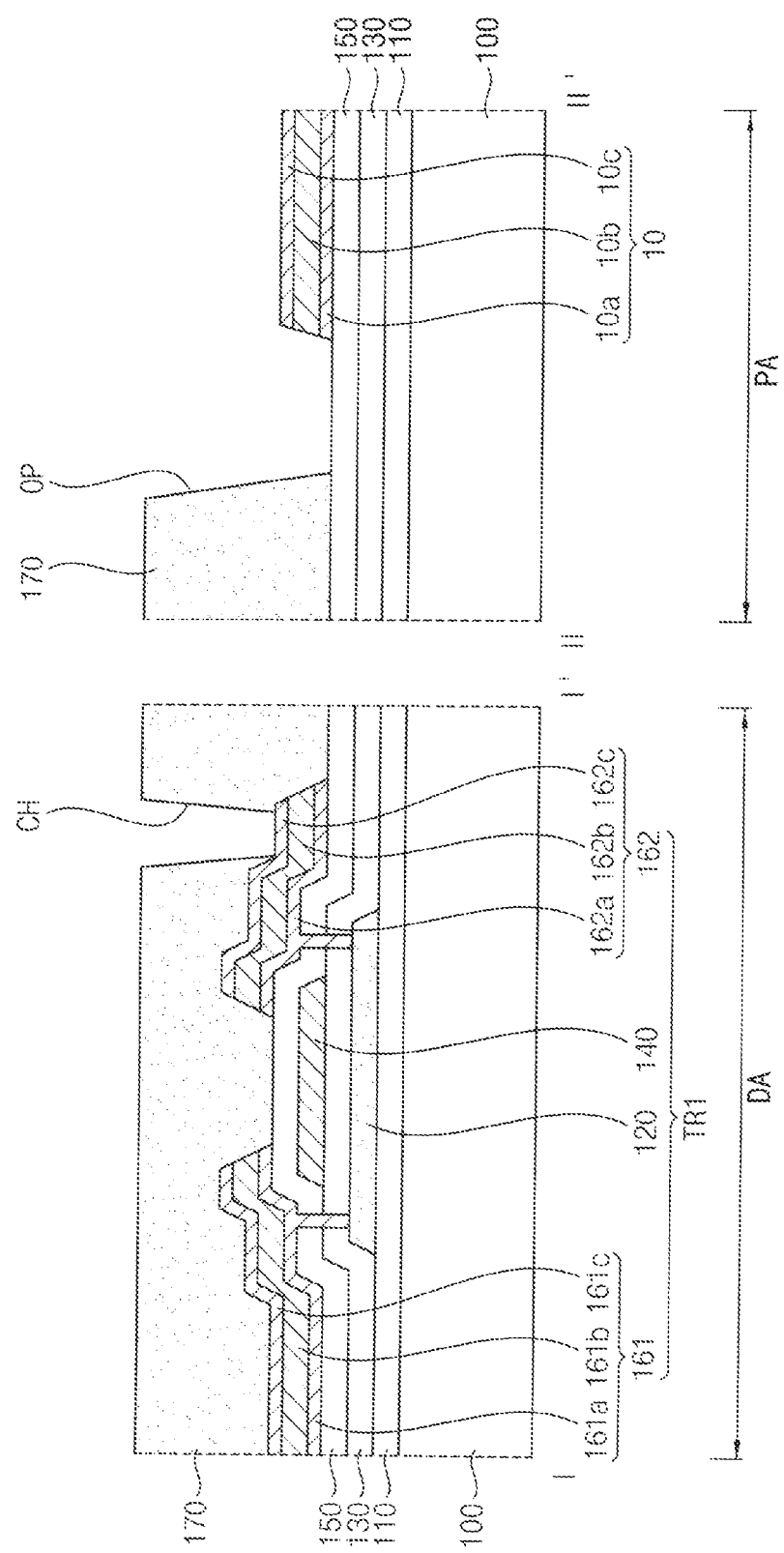

Referring to FIG. 7, the insulating layer 170 including the contact hole CH exposing a portion of the drain electrode 162 and the opening OP exposing at least a portion of the first power supply line 10 may be formed on the pixel circuit and the first power supply line 10. For example, the insulating layer 170 covering the source electrode 161, the drain electrode 162, and the first power supply line 10 may be formed on the insulating interlayer 150, and the contact hole Ch and the opening may be formed in the insulating layer 170.

Figure 8:
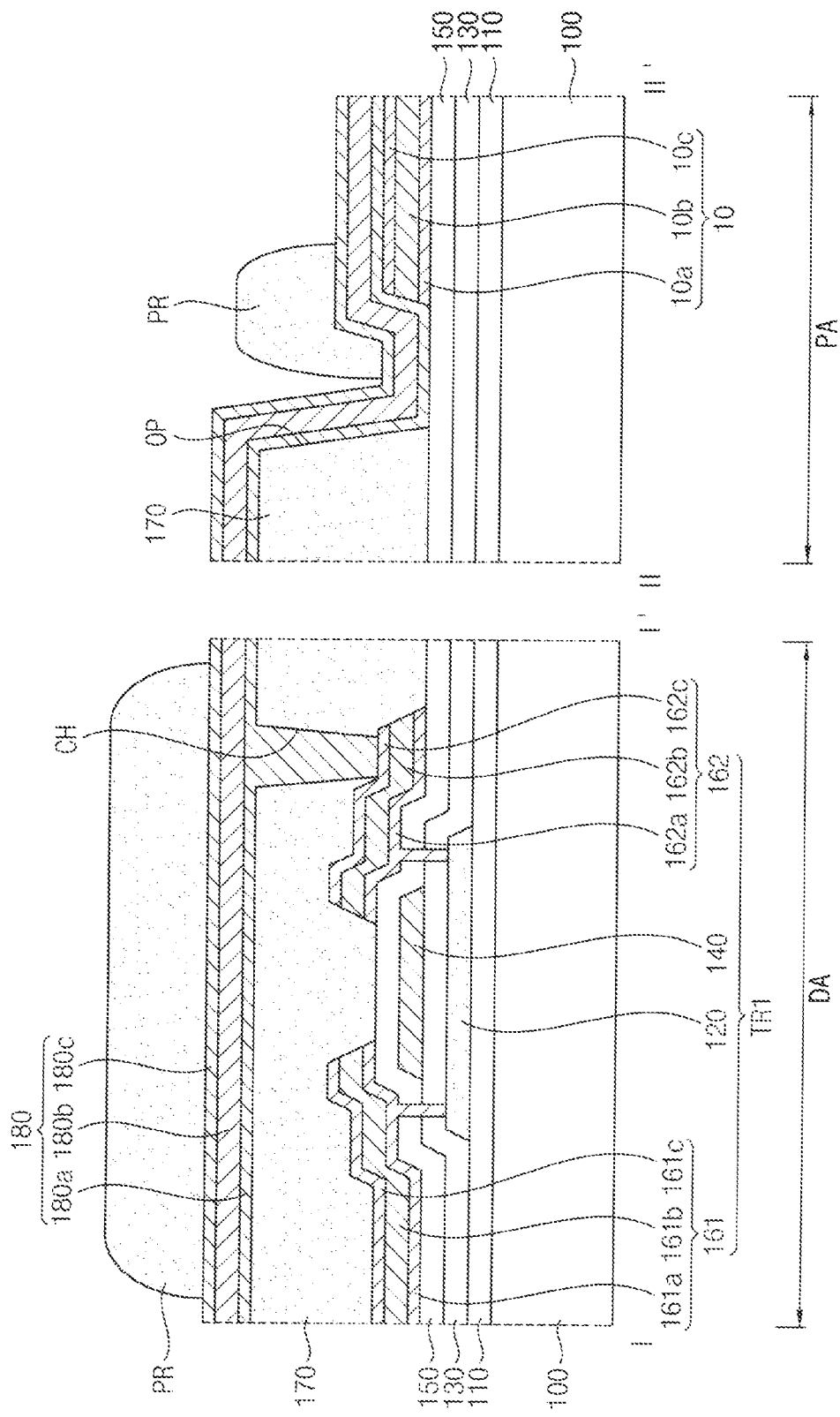
Figure 9:
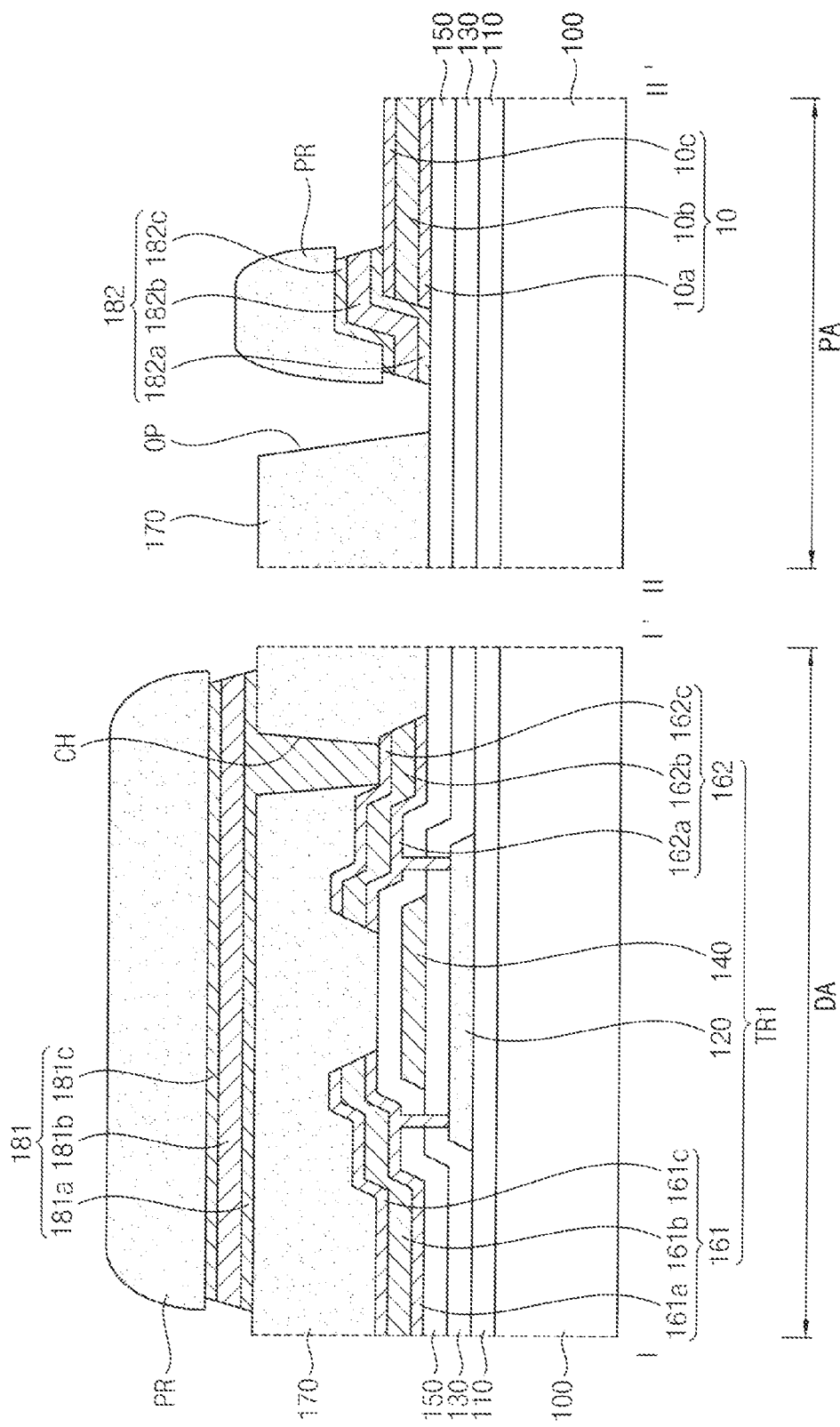

Referring to FIGS. 8 and 9, the pixel electrode layer 180 may be formed on the insulating layer 170, and the pixel electrode layer 180 may be etched to substantially simultaneously form the pixel electrode 181 electrically connected to the pixel circuit and the dummy pattern 182 covering the sidewall of the first power supply line 10 exposed by the opening OP of the insulating layer 170.

First, the pixel electrode layer 180 filling the contact hole CH and the opening OP of the insulating layer 170 may be formed on the insulating layer 170. In an embodiment, the pixel electrode layer 180 may include a material inducing a galvanic reaction with the second layer 10b of the first power supply line 10 in a presence of the etchant. For example, a first layer 180a including indium tin oxide (ITO) or indium zinc oxide (IZO), a second layer 180b including silver (Ag), and a third layer 180c including indium tin oxide (ITO) or indium zinc oxide (IZO) may be sequentially formed in the display area DA and the peripheral area PA on the insulating layer 170.

Then, a photoresist pattern PR may be formed on the pixel electrode layer 180. For example, a photoresist layer may be formed on the display area DA and the peripheral area PA on the pixel electrode layer 180, and the photoresist layer may be exposed and developed by using a photomask to form the photoresist pattern PR. The photoresist pattern PR may be positioned on the pixel electrode layer 180 to correspond to portions where the pixel electrode 181 and the dummy pattern 182 are formed.

Then, portions of the pixel electrode layer 180, which are not covered by the photoresist pattern PR, may be etched by providing an etchant on the pixel electrode layer 180 on which the photoresist pattern PR is formed. For example, the first, second, and third layers 180a, 180b, and 180c of the pixel electrode layer 180, which are not covered by the photoresist pattern PR, may be etched by using the etchant to substantially simultaneously form the pixel electrode 181 and the dummy pattern 182.

Since the dummy pattern 182 covers the sidewall of the first power supply line 10 exposed by the opening OP of the insulating layer 170, the etchant may not contact the sidewall of the first power supply line 10 exposed by the opening OP of the insulating layer 170. Accordingly, although silver atoms (Ag) included in the pixel electrode 181 are ionized by the etchant to generate silver ions (AO, since the dummy pattern 182 covers the sidewall of the first power supply line 10, a reaction between silver ions (AO generated in the process of etching the pixel electrode layer 180 and aluminum atoms (Al) included in the second layer 10b of the first power supply line 10 may not occur. Further, since the dummy pattern 182 and the pixel electrode 181 are substantially simultaneously formed, an additional process for forming the dummy pattern 182 may not be required. Accordingly, manufacturing time and manufacturing cost of the display device may be reduced.

Referring to FIG. 5, the emission layer 200 and the opposite electrode 210 may be sequentially formed on the pixel electrode 181.

First, the pixel defining layer 190 covering the pixel electrode 181 may be formed on the insulating layer 170, and the pixel opening exposing the upper surface of the pixel electrode 181 may be formed in the pixel defining layer 190. Then, the emission layer 200 may be formed in the pixel opening, and the opposite electrode 210 may be formed on the emission layer 200 and the pixel defining layer 190.

Figure 10:
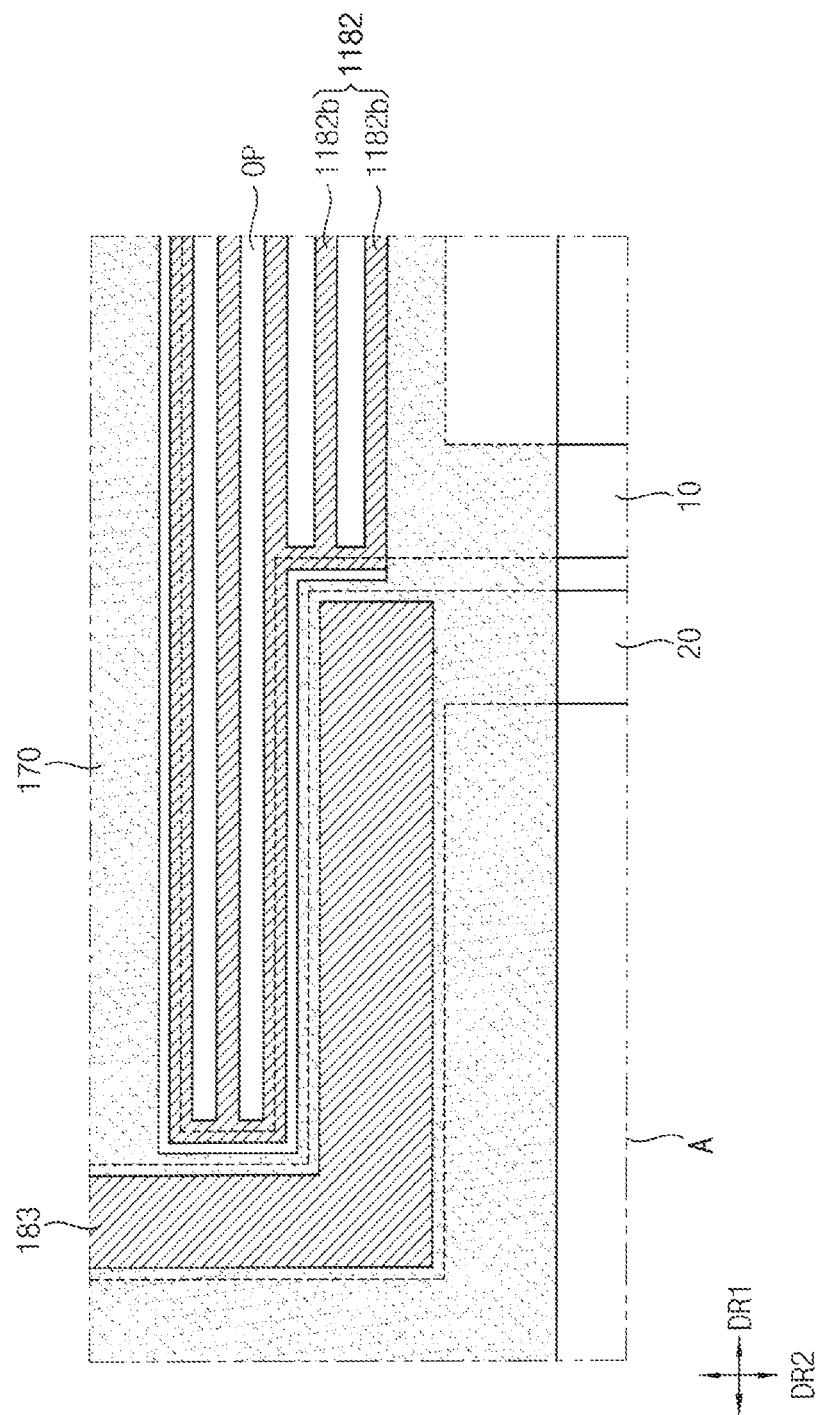
FIG. 10 is a plan view illustrating a portion of a peripheral area of another embodiment of the display device of FIG. 1.

FIG. 10 is a plan view illustrating a portion of a peripheral area PA of a display device according to another embodiment. For example, FIG. 10 may illustrate another example of the area A in FIG. 1.

The peripheral area PA of the display device described with reference to FIG. 10 may be substantially the same as or similar to the peripheral area PA of the display device described with reference to FIG. 4 except for a structure of a dummy pattern 1182. Accordingly, redundant descriptions of the same components will be omitted for descriptive convivence.

Referring to FIGS. 1 and 10, a dummy pattern 1182 and the connection pattern 183 may be disposed in the peripheral area PA on the insulating layer 170. The dummy pattern 1182 may cover the sidewall of the first power supply line 10 exposed by the opening OP of the insulating layer 170.

In an embodiment, the dummy pattern 1182 may include an outer portion 1182a overlapping the sidewall of the first power supply line 10 exposed by the opening OP of the insulating layer 170 and an inner portion 1182b overlapping the upper surface of the first power supply line 10 exposed by the opening OP of the insulating layer 170.

In an embodiment, the inner portion 1182b of the dummy pattern 1182 may include a plurality of lines connecting different portions of the outer portion 1182a of the dummy pattern 1182. The plurality of lines of the inner portion 1182b of the dummy pattern 1182 may be substantially parallel to each other. For example, the plurality of lines of the inner portion 1182b of the dummy pattern 1182 may extend in the first direction DR1.

In the process of forming the pixel electrode 181 and the dummy pattern 1182 by etching the pixel electrode layer 180 in FIG. 8, when the difference in density between the pixel electrode 181 in FIG. 9 in the display area DA and the dummy pattern 1182 in the peripheral area PA is relatively large (for example, when the density of the pixel electrode 181 in the display area DA is higher than the density of the dummy pattern 1182 in the peripheral area PA), a developer, an etchant, etc. used in the process of etching the pixel electrode layer 180 may be non-uniformly distributed, and thus the pixel electrode layer 180 may be non-uniformly etched. However, in an embodiment, since the dummy pattern 1182 includes the inner portion 1182b overlapping the upper surface of the first power supply line 10 exposed by the opening OP of the insulating layer 170, the density of the dummy pattern 1182 in the peripheral area PA may increase. Accordingly, the difference in density between the pixel electrode 181 in the display area DA and the dummy pattern 1182 in the peripheral area PA may decrease, and the etch uniformity of the pixel electrode layer 180 may be improved.

The display device according to the embodiments may be applied to a display device included in a computer, a notebook, a mobile phone, a smartphone, a smart pad, a PMP, a PDA, an MP3 player, or the like.

Although the display devices and the methods of manufacturing the display devices according to the embodiments have been described with reference to the drawings, the illustrated embodiments are examples, and may be modified and changed by a person having ordinary knowledge in the relevant technical field without departing from the technical spirit of the present invention described in the following claims.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A display device, comprising:
a substrate having a display area and a peripheral area;
a pixel disposed on the substrate in the display area, the pixel comprising a pixel circuit, a pixel electrode electrically connected to the pixel circuit, an emission layer disposed on the pixel electrode, and an opposite electrode disposed on the emission layer;
a power supply line disposed on the substrate in the peripheral area supply a power voltage to the pixel;
an insulating layer covering the pixel circuit and the power supply line, the insulating layer having an opening exposing at least a portion of the power supply line; and
a dummy pattern comprising a same material as the pixel electrode, the dummy pattern covering a sidewall of the power supply line exposed by the opening of the insulating layer.

2. The display device of claim 1, wherein the power supply line comprises a first layer, a second layer disposed on the first layer, and a third layer disposed on the second layer, and
wherein the dummy pattern comprises a material inducing a galvanic reaction with the second layer of the power supply line in a presence of an electrolyte.

3. The display device of claim 2, wherein the dummy pattern comprises silver (Ag).

4. The display device of claim 2, wherein the second layer of the power supply line comprises aluminum (Al).

5. The display device of claim 2, wherein the dummy pattern comprises a first layer, a second layer disposed on the first layer, and a third layer disposed on the second layer, and
wherein the second layer of the dummy pattern comprises a material inducing a galvanic reaction with the second layer of the power supply line in a presence of an electrolyte.

6. The display device of claim 5, wherein the second layer of the dummy pattern comprises silver (Ag).

7. The display device of claim 2, wherein the dummy pattern covers a sidewall of the second layer of the power supply line.

8. The display device of claim 2, wherein the first layer and the third layer of the power supply line respectively cover a lower surface and an upper surface of the second layer of the power supply line.

9. The display device of claim 1, wherein a sidewall of the insulating layer surrounds the dummy pattern.

10. The display device of claim 1, wherein the dummy pattern covers a portion of an upper surface of the power supply line exposed by the opening of the insulating layer.

11. The display device of claim 1, wherein the dummy pattern comprises an outer portion overlapping the sidewall of the power supply line exposed by the opening of the insulating layer.

12. The display device of claim 11, wherein the dummy pattern further comprises an inner portion overlapping an upper surface of the power supply line exposed by the opening of the insulating layer.

13. The display device of claim 12, wherein the inner portion of the dummy pattern comprises a plurality of lines connecting different portions of the outer portion of the dummy pattern.

14. The display device of claim 13, wherein the plurality of lines of the inner portion of the dummy pattern are substantially parallel to each other.

15. The display device of claim 1, wherein the pixel circuit comprises an active layer, a gate electrode overlapping the active layer, and source and drain electrodes electrically connected to the active layer, and
wherein the power supply line comprises a same material as the source and drain electrodes.

16. The display device of claim 1, further comprising a driving voltage line connecting the pixel to the power supply line, wherein the power supply line is configured to supply the power voltage to the driving voltage line.

* * * * *